United States Patent
Chang et al.

(10) Patent No.: US 7,015,730 B2
(45) Date of Patent: Mar. 21, 2006

(54) MIX-TYPE SAMPLE AND HOLD CIRCUIT OF RECEIVING END AND RECEIVING METHOD THEREOF

(75) Inventors: Chia-Jun Chang, Taipei (TW); Chao-Cheng Lee, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 2 days.

(21) Appl. No.: 10/851,175

(22) Filed: May 24, 2004

(65) Prior Publication Data

US 2004/0263368 A1    Dec. 30, 2004

(30) Foreign Application Priority Data

Jun. 27, 2003    (TW) ............................... 92117515 A

(51) Int. Cl.
    *G11C 27/02* (2006.01)
(52) U.S. Cl. ....................................................... 327/94
(58) Field of Classification Search ................. 327/91, 327/94, 96; 341/122
    See application file for complete search history.

(56) References Cited

U.S. PATENT DOCUMENTS

| 6,407,687 | B1 * | 6/2002 | Martin et al. ............... 341/122 |
| 6,518,800 | B1 * | 2/2003 | Martin et al. ............... 327/94 |
| 2003/0090400 | A1 * | 5/2003 | Barker ....................... 341/144 |

* cited by examiner

Primary Examiner—My-Trang Nu Ton
(74) Attorney, Agent, or Firm—Troxell Law Office, PLLC

(57) ABSTRACT

The invention is to provide a receiving end architecture comprising a variable gain amplifier, for outputting a pair of differential signals comprising a first signal and a second signal via a first and a second outputs respectively according to the receiving signal through adjusting the amplitude of the receiving signal; a mix-type sample-and-hold circuit for outputting a first sampled signal via a first end and a second sampled signal via a second end and then outputting the second sampled signal via the first end and the first sampled signal via the second end through performing sample-and-hold on the pair of differential signals; and an analog/digital converter coupled to the mix-type sample-and-hold circuit for generating a digital signal according to the first and the second sampled signals.

14 Claims, 6 Drawing Sheets

MIX-TYPE SAMPLE AND HOLD CIRCUIT OF RECEIVING END AND RECEIVING METHOD THEREOF

FIELD OF THE INVENTION

The present invention relates to a signal receiving circuit and a receiving method thereof, and more particularly, to a mix-type sample-and-hold circuit of an receiving end and a receiving method thereof.

BACKGROUND OF THE INVENTION

Conventionally, a framework composed of a variable gain amplifier (VGA), a sample-and-hold circuit (SHC), and an analog/digital converter (A/D), which are serially connected, is used as a receiving end (Rx) for receiving analog signals. Thus, an analog signal received by the input terminal is first amplified/reduced by the VGA, and then the amplified/reduced signal is sampled by the SHC, and finally the sampled signal is converted by the A/D converted into a digital signal.

There are two kinds of conventional framework of receiving end, that is, the single-line framework and the dual-line framework. Please refer to FIG. 1, which is a schematic diagram depicting a conventional receiving end with single-line framework. As seen in FIG. 1, not only the receiving end 100 is composed of a VGA 110, a SHC 120 and an A/D converter 130, which are serially connected, but also a single-line 115 is used for connecting the VGA 110 and the SHC 120, and a single-line 125 is used for connecting the SHC 120 and the A/D converter 130, since the VGA 110 has only a single output.

Wherein, an analog signal 140 received by the receiving end 100 is first being amplified by the VGA 110, and then the amplified signal is sampled by the SHC 120, and finally the sampled signal is being fed into the A/C converter 130 to be converted into a digital signal.

However, since the analog signal 104 amplified by the VGA 110 carries noise, a receiving end with a dual-line framework is designed to overcome the aforementioned shortcoming.

Please refer to FIG. 2, which is a schematic diagram depicting a conventional receiving end with dual-line framework. As seen in FIG. 2, the receiving end 200 is similarly composed of a VGA 210, a SHC 220 and an A/C converter 230, which are serially connected, but there are dual-lines 213, 215 used for connecting the VGA 210 and the SHC 220, and dual-lines 223, 225 used for connecting the SHC 220 and the A/C converter 230, since the VGA 210 has a pair of differential outputs.

Wherein, an analog signal 140 received by the input terminal framework 200 is first being amplified by the VGA 210, and a pair of amplified differential signals are then sampled by the SHC 220 such that the noise can be eliminated since the amplified differential signals have the noise with the same quantity, and finally the sampled signals are fed into the A/C converter 130 to be converted into a digital signal.

The waveform of the sampled analog signal 140 produced by the SHC of the conventional receiving ends 100 and 200 are shown in FIG. 3. The sine wave analog signal 300 is sampled to form either a square wave signal 310 or a discrete signal 320.

However, if the magnitude of the analog signal 140 amplified by the VGA is too large, the analog signal is likely to oscillate and causes signal distortion since the frequency of the inputted analog signal is the same as that of the feedback analog signal in the feedback loop of the receiving end.

Please refer to FIG. 4, which is a frequency spectrum of a FFT sine wave. As seen in FIG. 4, the two peaks near a specific frequency, i.e. 2500 Hz in a frequency domain represent respectively the wave crest and the wave an exemplified sine wave in a time domain while applying a Fast Fourier Transform on the sine wave analog signal.

Moreover, please refer to FIG. 5, which is a frequency spectrum of a FFT sine wave after it being sampled by the SHC. As seen in FIG. 5, If the sampling frequency of the SHC is far larger than the frequency of the sine wave, the amplitude and the position of two peaks in the frequency domain, which represent respectively the wave crest and the wave of the sampled sine wave in time domain is almost the same with the two peaks shown in FIG. 4.

If the conventional receiving end architecture has a feedback loop, the transfer function of the conventional receiving end can be shown as following:

$$A(f)/(1+A(f)*\beta(f))$$

Where A is a gain function;
  $\beta$ is a feedback function; and
  f is frequency.

Since the conventional receiving end architecture is composed of a VGA, a SHC and an A/D converter, the gain function A(f) can be decomposed into the following:

$$A_1(f)*A_2(f)*A_3(f)$$

Where $A_1(f)$, $A_2(f)$, and $A_3(f)$ are gain function of the VGA, the SHC and the A/D converter respectively.

Those skilled in the art will know that if the gain function of the VGA, that is, the value of $A_1(f)$, is too large while the value of f in the equation: $A_1(f)*A_2(f)*A_3(f)$ is the same, the phase margin of the transfer function of the conventional receiving end is as following:

$$1/|(A(f)*\beta(f))|<1$$

In this manner, the phase margin of the analog signal in the conventional receiving end is smaller than 1 such that the signal is instable and is likely to oscillate causing signal distortion.

In view of the foregoing description, the present invention provides a receiving end architecture with mix-type sample-and-hold circuit that is capable of reducing the signal distortion caused by the oscillation of analog signal in the receiving end.

SUMMARY OF THE INVENTION

There is one of the objects of the invention to provide a receiving end architecture with a mix-type sample-and-hold circuit to overcome the shortcoming of the conventional art. The receiving end architecture comprises: a variable gain amplifier, for outputting a pair of differential signals comprising a first signal and a second signal via a first and a second outputs respectively according to the receiving signal through adjusting the amplitude of the receiving signal; a mix-type sample-and-hold circuit for outputting a first sampled signal via a first end and a second sampled signal via a second end and then outputting the second sampled signal via the first end and the first sampled signal via the second end through performing sample-and-hold on the pair of differential signals; and an analog/digital converter coupled to the mix-type sample-and-hold circuit for generating a digital signal according to the first and the second sampled signals.

It is another one of the objects of the present invention to provide a method for receiving a signal of a receiving end. The method comprises the steps of: providing a pair of differential signals comprising a first signal and a second signal; sampling the first signal by a first sample-and-hold circuit and sampling the second signal by a second sample-and-hold circuit; sampling the first signal by a second sample-and-hold circuit and sampling the second signal by a first sample-and-hold circuit; and generating a digital signal according to the first and the second sampled signals.

These and other objectives of the claimed invention will no doubt become obvious to those of ordinary skill in the art after reading the following detailed description of the preferred embodiment that is illustrated in the various figures and drawings.

DESCRIPTION OF THE PREFERRED EMBODIMENT

Figure 6:
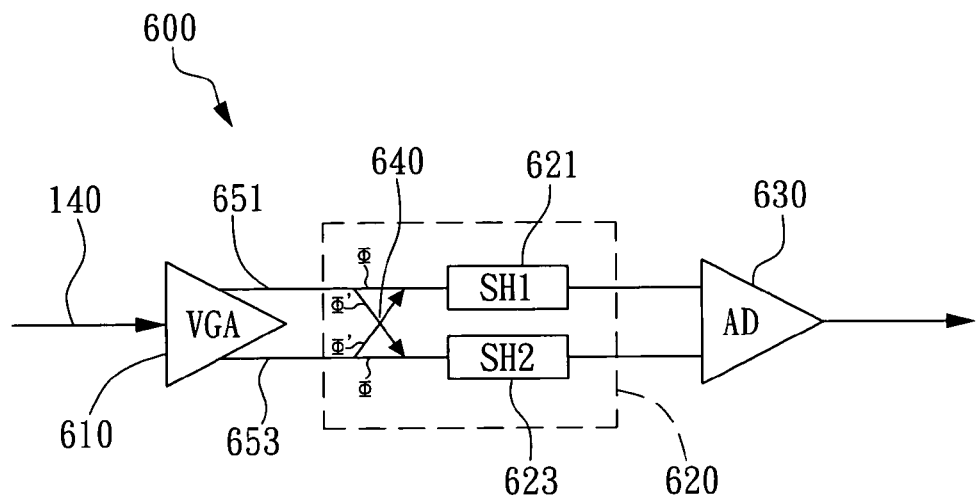
FIG. 6 is a schematic diagram depicting a receiving end architecture with a mix-type sample-and-hold circuit according to a embodiment of the present invention.

Please refer to FIG. 6, which is a schematic diagram depicting a receiving end architecture with a mix-type sample-and-hold circuit according to the embodiment of the present invention. The receiving end architecture 600 is composed of a variable gain amplifier 610, a mix-type sample-and-hold circuit 620, and a analog/digital converter 630. In this embodiment, the mix-type sample-and-hold circuit 620 is composed of two ordinary sample-and-hold circuits 621, 623, and a switch 640 for controlling the two ordinary sample-and-hold circuits 621, 623 to respectively receive signals transmitted from the two outputs of the variable gain amplifier 610 simultaneously.

Figure 1:
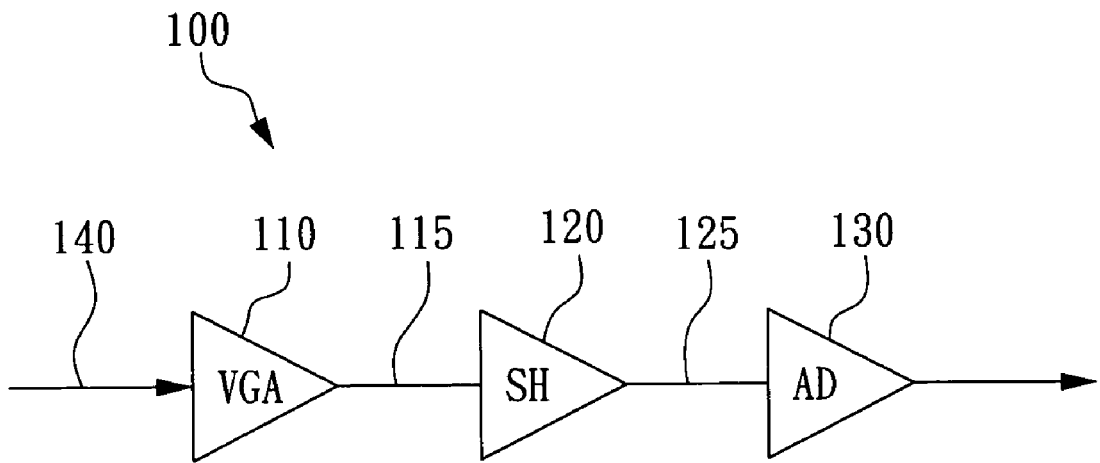
FIG. 1 is a schematic diagram depicting a conventional receiving end with single-line framework.
Figure 2:
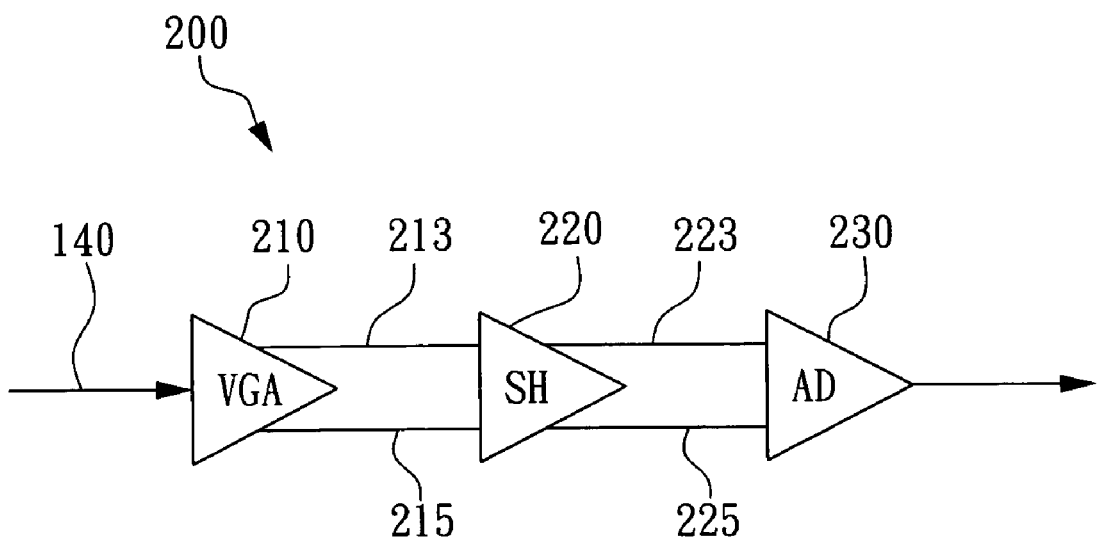
FIG. 2 is a schematic diagram depicting a conventional receiving end with dual-line framework.
Figure 3:
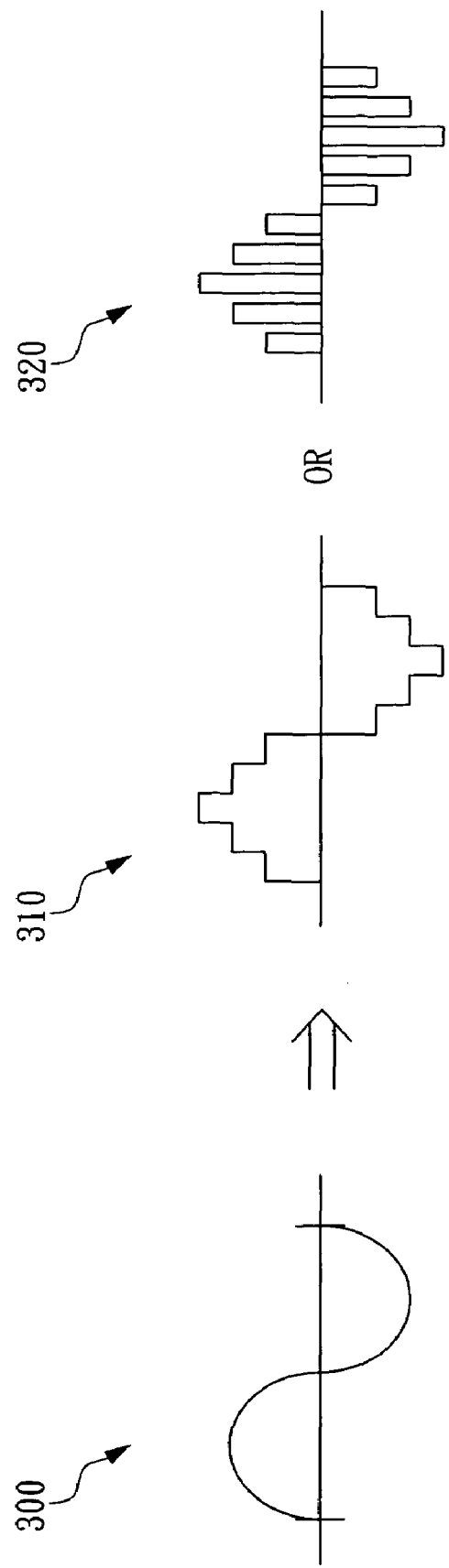
FIG. 3 is a schematic diagram showing a waveform of an analog signal sampled by the conventional receiving ends shown in FIG. 1 and FIG. 2.

When a sine wave signal 300 of FIG. 3 is being received by the variable gain amplifier 610 of the receiving end 600, the variable gain amplifier 610 adjusts, i.e. either amplify or reduce, the received signal to output a pair of differential signals 651 and 653 to the mix-type sample-and-hold circuit 620. The switch 640 of the mix-type sample-and-hold circuit 620 is to control the two sample-and-hold circuit 621, 623 to respectively receive the differential signal 651 and 653 respectively. That is, if the switch 640 is in a first status, the sample-and-hold circuit 621, 623 coupled to VGA 610 to respectively receive the differential signal 651 and 653 and input the differential signal 651 and 653 into the corresponding sample-and-hold circuits 621 and 623 via the paths Φ shown in FIG. 6, and if the switch 640 is in a second status, the sample-and-hold circuit 621, 623 coupled to VGA 610 to respectively receive the differential signal 653 and signal 651 and input the differential signal 651 and 653 into the corresponding sample-and-hold circuits 621 and 623 via the paths Φ' shown in FIG. 6. The switch 640 changes its status every predetermined period of time.

Figure 4:
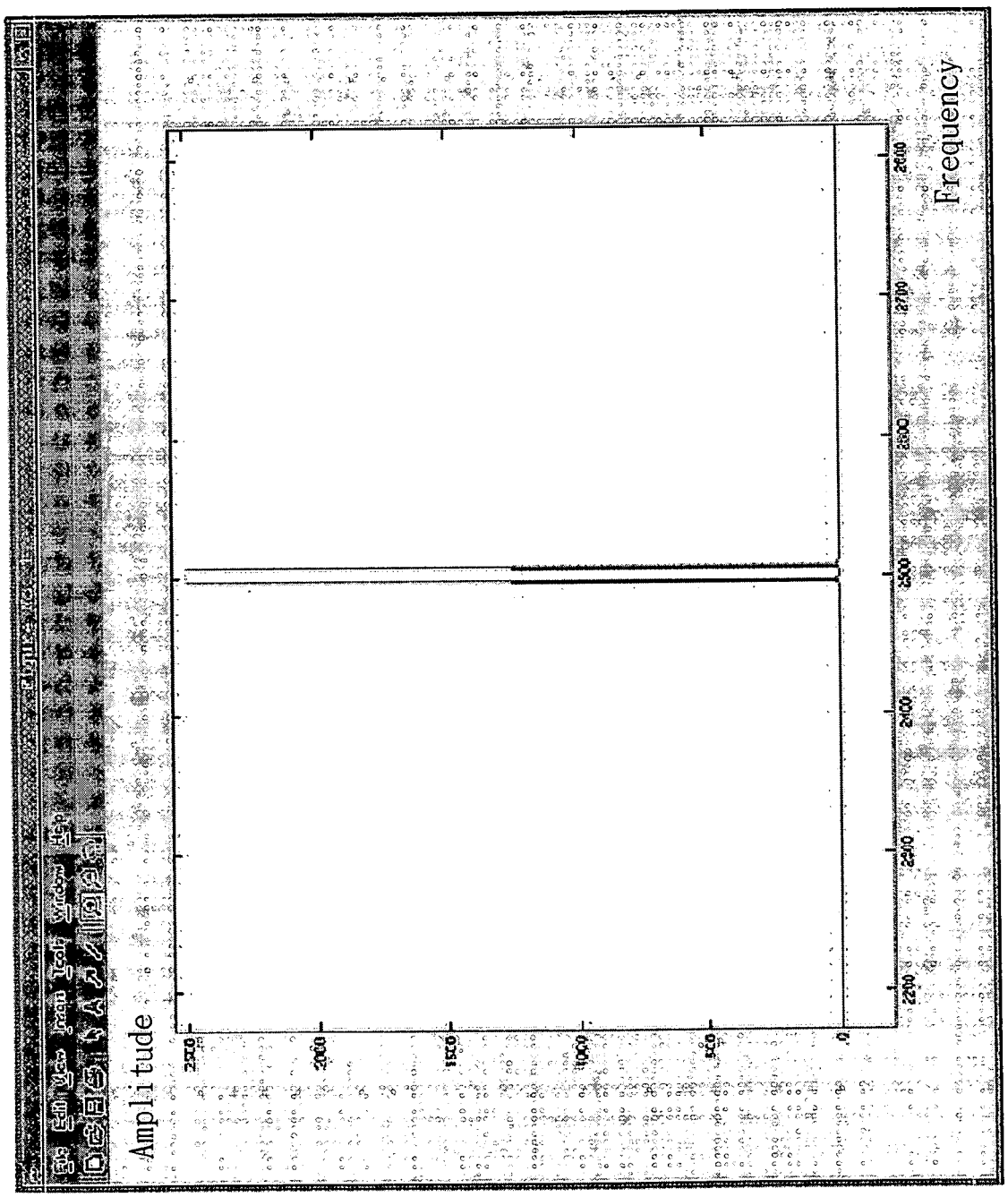
FIG. 4 is a frequency spectrum of a FFT sine wave.
Figure 7:
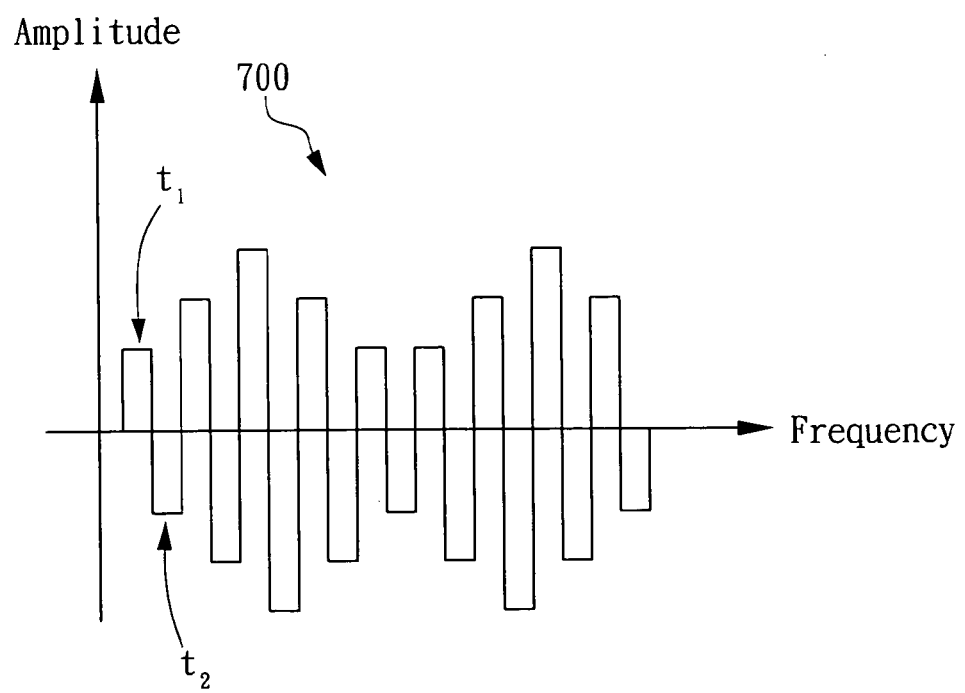
FIG. 7 is a waveform of the sampled differential signal of the receiving end architecture shown in FIG. 6.
Figure 8:
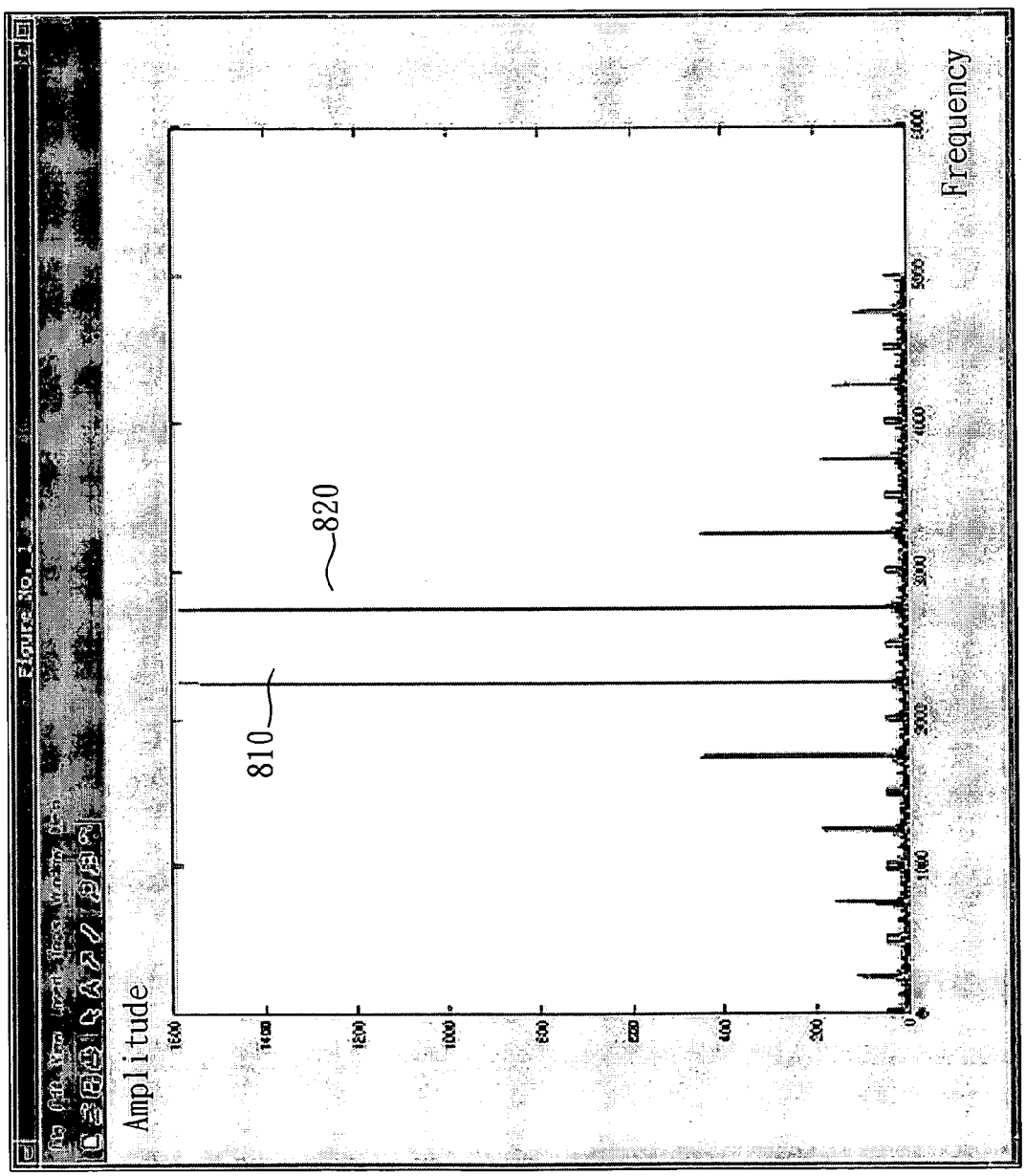
FIG. 8 is a frequency spectrum of the FFT sine wave shown in FIG. 7.

Pleases refer to FIG. 7, which is a timing diagram of the sampled signals 700 of the mix-type sample-and-hold circuit 620. It should be noted that the phase of the sampled signals changes alternatively. For example, The sampled signal sampled at t1 is different from that of the sampled signal sampled at t2. If FFT is performed on the sampled signals 700 of FIG. 7, the result is that the two peaks of the sampled signals in frequency domain are also shown in FIG. 8. However, the frequency of the two peaks are different from the other two peaks shown in FIG. 4, which is the FFT sine signal sampled in the conventional way. That is, the frequency of the signal outputted by the mix-type sample-and-hold circuit 620 is different from that of the signal outputted from the VGA 610. In this manner, the phase margin of the received analog signal in the receiving end can be larger than 1, such that the receiving end architecture disclosed in this embodiment can keep the received analog signal stable without oscillation causing signal distortion.

Figure 5:
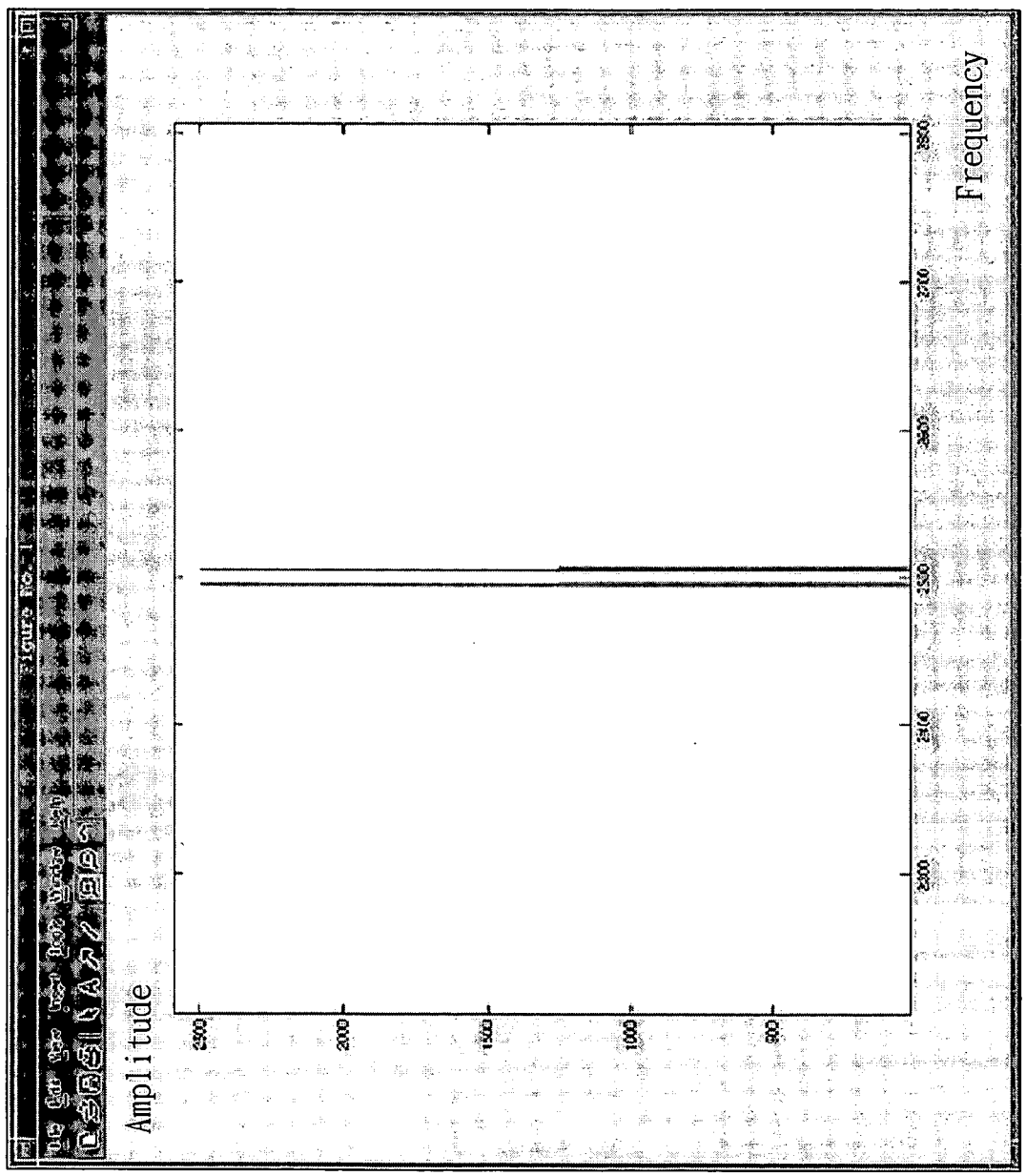
FIG. 5 is a frequency spectrum of a FFT sine wave after it being sampled by a conventional sample-and-hold circuit.

Please refer to FIG. 8 and compare it with FIG. 5, the two peaks 810, 820 representing respectively the wave crest and the wave trough of the wave shown in FIG. 7 is still at the vicinity of the frequency at 2500, but at the position farther away from the position of the corresponding two peaks shown in FIG. 5.

The sampled differential signals outputted from the mix-type sample-and-hold circuit 620 will be changed into the corresponding digital signal by the A/D converter 630 such that the frequency of the digital signal of the A/D converter 630 is different the frequency of the signals of the variable gain amplifier 610 and the mix-type sample-and-hold circuit 620.

Hence, In an receiving end architecture 600 according to the preferred embodiment of the present invention, the frequency of the signal 140 will vary during it is being processed by the variable gain amplifier 610, the mix-type sample-and-hold circuit 620, and the A/D converter 630, that is, the signal being processed in the different stage of the multi-stage architecture will have different frequency.

If the transfer function of the f receiving end architecture 600 is expressed as following:

$$A(f)/(1+A(f)*\beta(f))$$

Where A is a gain function;
B is a feedback function; and
f is frequency.

Since the frequency of the signal of the A/D converter 630 is different than that of the variable gain amplifier 610 and the mix-type sample-and-hold circuit 620, the gain function A(f) can be decomposed into the following:

$$A_1(f)*A_2(f)*A_3(f)$$

and the phase margin of the transfer function representing the receiving end architecture 600 is as following:

$$1/|(A(f)*\beta(f))|>1$$

Thus, the phase margin of the analog signal in the receiving end architecture 600 can be larger than 1 such that the signal is much more stable and is unlikely to oscillate causing signal distortion.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A receiving end architecture for receiving a signal, comprising:
   a variable gain amplifier, for outputting a pair of differential signals comprising a first signal and a second signal via a first and a second outputs respectively according to the receiving signal through adjusting the amplitude of the receiving signal;
   a mix-type sample-and-hold circuit for outputting a first sampled signal via a first end and a second sampled signal via a second end and then outputting the second sampled signal via the first end and the first sampled signal via the second end through performing sample-and-hold on the pair of differential signals; and
   an analog/digital converter coupled to the mix-type sample-and-hold circuit for generating a digital signal according to the first and the second sample signals.

2. The apparatus of claim 1, wherein the mix-type sample-and-hold circuit further comprises a first sample-and-hold circuit, a second sample-and-hold circuit, and a switch for selectively coupling the first and the second outputs to the first and the second sample-and-hold circuits for sampling and holding the first and the second signals.

3. The apparatus of claim 2, wherein when the switch is in a first status, the first sample-and-hold circuit is coupled to the first output for sampling and holding the first signal, the second sample-and-hold circuit is coupled to the second output for sampling and holding the second signal, and when the switch is in a second status, the first sample-and-hold circuit is coupled to the second output for sampling and holding the second signal and the second sample-and-hold circuit is coupled to the first output for sampling and holding the first signal.

4. The apparatus of claim 3, wherein the switch changes its status periodically.

5. A mix-type sample-and-hold circuit, comprising:
   a first receiving end for receiving a first signal;
   a second receiving end for receiving a second signal;
   a first sample-and-hold circuit;
   a second sample-and-hold circuit; and
   a switch for selectively coupling the first and the second receiving ends to the first and the second sample-and-hold circuits for sampling and holding the first and the second signals;
   wherein when the switch is in a first status, the first sample-and-hold circuit is coupled to the first output for sampling and holding the first signal, the second sample-and-hold circuit is coupled to the second output for sampling and holding the second signal, and when the switch is in a second status, the first sample-and-hold circuit is coupled to the second output for sampling and holding the second signal and the second sample-and-hold circuit is coupled to the first output for sampling and holding the first signal.

6. The apparatus of claim 5, wherein the switch changes it status periodically.

7. A method for receiving a signal of a receiving end, the method comprising the steps of:
   providing a pair of differential signals comprising a first signal and a second signal;
   sampling the first signal by a first sample-and-hold circuit and sampling the second signal by a second sample-and-hold circuit;
   sampling the first signal by a second sample-and-hold circuit and sampling the second signal by a first sample-and-hold circuit; and
   generating a digital signal according to the first and the second sampled signals.

8. The method of claim 7, wherein a pair of differential signals comprising a first signal and a second signal is provided through adjusting the amplitude of a receiving signal.

9. The method of claim 7, further comprising the step of: controlling the first sample-and-hold circuit of sample one of the first and the second signals and controlling the second sample-and-hold circuit to sample the other one of the first and the second signals.

10. The method of claim 7, further comprising the step of:
    sampling the second signal after sampling the first signal and sampling the first signal after sampling the second signal by the first sample-and-hold circuit.

11. The method of claim 7, further comprising the step of:
    sampling the second signal after sampling the first signal and sampling the first signal after sampling the second signal by the second sample-and-hold circuit.

12. A method for sampling a signal, comprising:
    providing a pair of differential signals comprising a first signal and a second signal;
    sampling the first signal by a first sample-and-hold circuit to provide a first sampled signal and sampling the second signal by a second sample-and-hold circuit to provide a second sampled signal; and
    sampling the first signal by a second sample-and-hold circuit to provide the sampled signal and sampling the second signal by a first sample-and-hold circuit to provide the second sampled signal.

13. The method of claim 12, further comprising the step of: sampling the second signal after sampling the first signal and sampling the first signal after sampling the second signal by the first sample-and-hold circuit.

14. The method of claim 12, further comprising the step of: sampling the second signal after sampling the first signal and sampling the first signal after sampling the second signal by the second sample-and-hold circuit.

* * * * *